(12) United States Patent  
Tomimatu

(10) Patent No.: US 6,229,618 B1
(45) Date of Patent: May 8, 2001

(54) METHOD OF IMPROVING REGISTRATION ACCURACY AND METHOD OF FORMING PATTERNS ON A SUBSTRATE USING THE SAME

(75) Inventor: Yoshikatu Tomimatu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/090,423

(22) Filed: Jun. 4, 1998

(30) Foreign Application Priority Data

Dec. 15, 1997 (JP) .................................................. 9-345305

(51) Int. Cl.[7] .................................................. G01B 9/02
(52) U.S. Cl. ................................................ 356/516; 356/401
(58) Field of Search ..................... 355/53, 55; 356/399, 356/400, 401, 363, 516, 515, 517

(56) References Cited

U.S. PATENT DOCUMENTS 5,438,413 * 8/1995 Mazor et al. ........................... 356/363

FOREIGN PATENT DOCUMENTS 59-148334   8/1984   (JP).
2-2105      1/1990   (JP).

* cited by examiner

*Primary Examiner*—Frank G. Font
*Assistant Examiner*—Andrew H. Lee
(74) *Attorney, Agent, or Firm*—McDermott, Will & Emery

(57) ABSTRACT

A method of improving registration accuracy of a semiconductor device, and a method of forming a pattern on a substrate using the improving method are provided in which an amount of offset in registration can readily be calculated even when a registration accuracy measurement mark has a small step. First, a first resist film covering at least an edge portion of a first registration accuracy measurement mark is formed. Thereafter, using an optical system utilizing interference, a position of the edge portion of the first registration accuracy measurement mark is detected, with the step enlarged seemingly. Thereafter, distance between opposing ends of first and second registration accuracy measurement marks is measured.

7 Claims, 7 Drawing Sheets

※ MEASUREMENT POINT

METHOD OF IMPROVING REGISTRATION ACCURACY AND METHOD OF FORMING PATTERNS ON A SUBSTRATE USING THE SAME

BACKGROUND OF THE INVENTION

1. Field of the Invention

The present invention relates to a method of improving registration accuracy and to a method of forming patterns on a substrate using the method. More specifically, the present invention relates to a method of improving registration accuracy in a step of exposure during manufacturing of a semiconductor device, and to a method of forming patterns on a substrate using the method.

2. Description of the Background Art

Conventionally, measurement of positional offset of a registration accuracy measurement mark has been utilized as a method of measuring an amount of offset in registration during the steps of manufacturing a semiconductor device. In the measurement of offset of the registration accuracy measurement mark, first, a registration accuracy measurement mark is formed, and a position of a step of the measurement mark is found. Based on the position of the step, the position of the measurement mark is found. Further, based on the position of the measurement mark, an amount of offset in registration is measured. As to a specific method of finding the position of the step, a method has been known in which light beams are directed to the step and intensity of reflected light beams is found. In this method of finding the position of the step in accordance with the intensity of reflected light beams, the position of the step is detected utilizing the phenomenon that light beams are reflected irregularly at the step so that intensity of the reflected light beams is lower at the step than other portions. That is, a portion where intensity of reflected light beams is lower is found.

The conventional method of improving registration accuracy will be described with reference to FIGS. 10 to 13.

In the conventional method of improving registration accuracy, referring to FIG. 10, positions of registration accuracy measurement marks are measured at measurement points on selected ones of a plurality of chips 102 formed on a wafer 101. In each measurement point, first and second registration accuracy measurement marks 201 and 202 are formed simultaneously with patterning of interconnections and the like. First registration accuracy measurement mark 201 is formed on the substrate, and second registration accuracy measurement mark 202 is formed on first registration accuracy measurement mark 201. FIGS. 11 and 12 are plan view and cross sectional view, respectively, of the first and second registration accuracy measurement marks 201 and 202 of this example.

At the time of inspection, referring to FIG. 12, light beams 204 are directed to first and second registration accuracy measurement marks 201 and 202. Of the light beams 204, a beam incident on an upper surface of second registration accuracy measurement mark 202 will be referred to as incident light beam 204a, and a beam reflected at the upper surface of second registration accuracy measurement mark 202 will be referred to as reflected light beam 204b. A beam incident on an upper surface of first registration accuracy measurement mark 201 will be referred to as incident light beam 204c, and a beam reflected on the upper surface of first registration accuracy measurement mark 201 will be referred to as reflected light beam 204d. A beam incident on an upper surface of the chip will be referred to as incident light beam 204i, and a beam reflected on the upper surface of the chip will be referred to as reflected light beam 204j. At this time, intensities of reflected light beams 204b, 204d and 204j are measured as shown in FIG. 13. Intensity of a light beam is higher when the light beam is reflected from a closer point. Intensities corresponding to reflected light beams 204b, 204d and 204j are represented by light intensities 219, 220, and 223, respectively. In order to detect the step by referring to the intensities, a step between light intensities such as observed at a boundary 224 or 227 is detected. Thus, the position of the edge of the registration accuracy measurement mark is found, and hence amount of offset in registration is found.

However, recently, degree of integration of semiconductor devices such as ICs and LSIs has been ever increasing, and the buses have been rapidly miniaturized. Accordingly, in the method of improving registration accuracy, measurement with the precision of 0.1 $\mu$m to 0.05 $\mu$m has come to be required.

The process for manufacturing devices includes repetition of patterning of interconnections.elements, deposition of an insulating film and patterning of interconnections. Here, when an interconnection of an upper layer is to be formed while unevenness of the underlying layer is not sufficiently made planar, focusing fails in the step of lithography for patterning the interconnection, resulting in formation of a dull or blurred interconnection pattern.

Widths of interconnection of VLSIs has been narrower and narrower as the devices have been miniaturized to high degree, and accordingly, margin of depth of focus (D.O.F) in lithography has been decreasing. In other words, tolerable range in focusing at the time of lithography becomes smaller. Therefore, unless the device surface is almost perfectly planarized over wide range, satisfactory patterning of interconnections cannot be ensured.

As the margin of the depth of focus decreases, the step of the registration accuracy measurement mark is reduced by rapid strides, from the order of several hundreds to several tens Å. As a result, the conventional method of finding a step in accordance with light intensities described above can no longer catch up to ensure sufficient accuracy. More specifically, when a step is very small, light intensities 220 and 223 are as shown in FIG. 13, making it difficult to clearly identify the boarder 227. Difficulty in identifying the step leads to difficulty in measurement or inspection of registration accuracy.

SUMMARY OF THE INVENTION

An object of the present invention is to provide a method of improving registration accuracy which allows easy detection of an amount of offset in registration even when a registration accuracy measurement mark has a small step.

Another object of the present invention is to provide a method of improving registration accuracy allowing, even when a registration accuracy measurement mark has a small step, easy detection of the step.

In accordance with an aspect of the present invention, the method of improving registration accuracy in a step of exposure during manufacturing of a semiconductor device includes the following steps. First, a registration accuracy measurement mark is formed on a semiconductor substrate. Thereafter, a first resist film covering at least an edge portion of the registration accuracy measurement mark is formed. Position of the edge portion of the registration accuracy measurement mark is detected by an optical system utilizing interference. As the edge portion of the registration accuracy measurement mark is covered by the first resist, optical distance (actual step of the measurement mark×refractive index) is increased because of the refractive index (1.5~1.8) of the first resist higher than that of air, even when the registration accuracy measurement mark has a small step. Therefore, when interference of reflected light beams are detected in the method of detecting a step by an interference optical system, the step in terms of the detected data is seemingly enlarged. Therefore, even if the step is small, identification of the position of the edge portion is facilitated. As a result, the position of the registration accuracy measurement mark can readily be detected, facilitating calculation of the amount of offset in registration. This enables improved registration accuracy in the manufacturing process of the semiconductor devices.

Further, the registration accuracy measurement mark may include a first registration accuracy measurement mark formed of a first layer. A second registration accuracy measurement mark formed of a second layer may be formed inner than a region where the first registration accuracy measurement mark is formed. Thereafter, a first resist film is formed to cover at least an edge portion of the first registration accuracy measurement mark. Positions of edge portions of the first and second registration accuracy measurement marks are detected by an interference optical system, and an amount of offset between the first and second registration accuracy measurement marks is calculated.

As the edge portion of the first registration accuracy measurement mark is covered by the first resist as described above, even when the first measurement mark has a low step, optical distance (actual step of the measurement mark× refractive index) is large, as the first resist has high refractive index (1.5~1.8). Therefore, when the step is detected by an interference optical system, the step in terms of data is seemingly enlarged. Therefore, identification of the first registration accuracy measurement mark is easy even if it has a small step. As a result, detection of the steps of first and second measurement marks is facilitated, and hence calculation of the amount of offset in registration based on the positions of the first and second measurement marks is facilitated. This enables improvement in registration accuracy in the process for manufacturing the semiconductor devices.

Preferably, the second registration accuracy measurement mark is formed to have a planar area smaller than the planar area on which the first registration accuracy measurement mark is formed, on the planar area where the first measurement mark is formed. Similar to the effect described above, this structure facilitates detection of even a small step, and thus facilitates calculation of the amount of offset of the first and second registration accuracy measurement marks. As a result, positions of edge portions of the first and second registration accuracy measurement marks are detected by an interference optical system, and the amount of offset between the first and second registration accuracy measurement marks can easily be calculated. This leads to improved registration accuracy in the process for manufacturing the semiconductor devices.

Preferably, the first registration accuracy measurement mark is formed such that it includes a plurality of parts formed to surround the second registration accuracy measurement mark. The first resist film may be formed to cover at least inner and outer end portions of the plurality of parts. Similar to the effect described above, such structure facilitates detection of even a small step. As a result, positions of edge portions of the first and second registration accuracy measurement marks are detected by an interference optical system, whereby the amount of offset between the first and second registration accuracy measurement marks can readily be calculated. This leads to improved registration accuracy in the process for manufacturing the semiconductor devices.

Preferably, the second registration accuracy measurement mark may consist of a second resist film which is of the same layer as the first resist film. In this structure, because of the first resist film, detection of the first measurement mark is facilitated, even when it has a small step. Therefore, even when the first measurement mark has a small step, the small step can be detected easily. This facilitates calculation of the amount of offset between the first and second measurement marks. As a result, registration accuracy can be improved in the process for manufacturing the semiconductor devices. Further, the process for manufacturing the semiconductor devices can be simplified as the first and second resist are formed simultaneously.

Further, the interference optical system may include a light source, a first mirror for splitting a light beam from the light source into two light beams, and a second mirror for reflecting one of the splitted beams. The optical system utilizing interference having such a structure enables easy detection of the step. As a result, an amount of offset in positions of measurement marks can readily be calculated. This leads to improved registration accuracy in the process for manufacturing the semiconductor devices.

According to another aspect of the present invention, the method of forming a pattern on a substrate utilizes a method of improving registration accuracy including the steps of forming a registration accuracy measurement mark on a semiconductor substrate, forming a first resist film covering at least an edge portion of the registration accuracy measurement mark, and thereafter, detecting position of the edge portion of the registration accuracy measurement mark by an optical system utilizing interference.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to FIGS. 1 to 9.

First Embodiment

Figure 1:
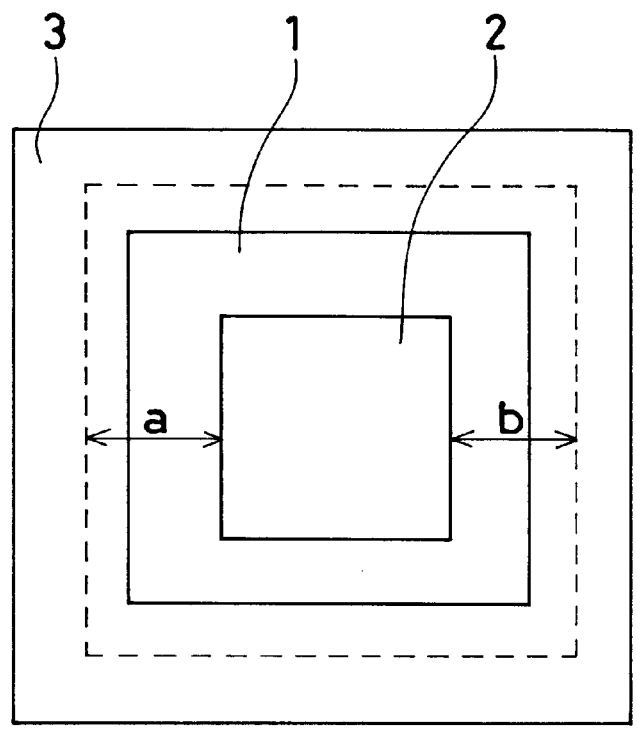
FIG. 1 is a plan view of a registration accuracy measurement mark and a resist accordance with a first embodiment of the present invention.
Figure 2:
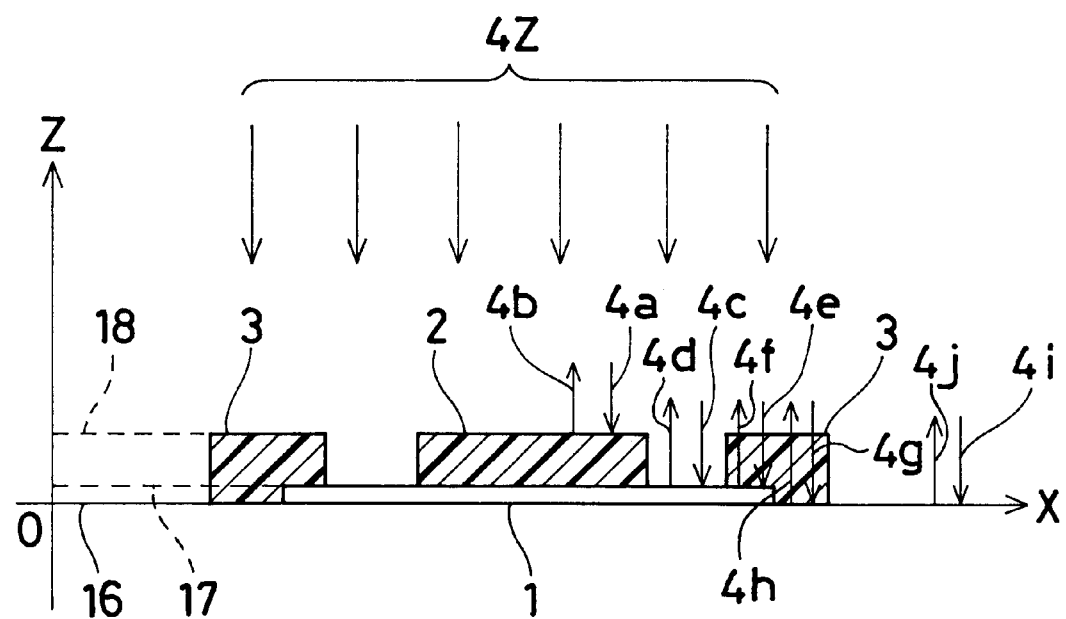
FIG. 2 is a cross sectional view of the registration accuracy measurement mark and the resist in accordance with the first embodiment of the present invention.

Referring to FIGS. 1 and 2, in the method of measuring an amount of offset in registration in accordance with the first embodiment, a first registration accuracy measurement mark 1 of a first layer is formed simultaneously with an interconnection pattern (not shown) on a chip of a semiconductor device (in the direction of the x axis in FIG. 2). Thereafter, a resist is patterned on the interconnection pattern, and at the same time, a second registration accuracy measurement mark 2 formed of the resist as the second layer is formed on the first registration accuracy measurement mark 1. Simultaneously with the formation of the second registration accuracy measurement mark 2 formed of the resist, a resist 3 is formed to cover an edge portion of the first registration accuracy measurement mark 1. In this state, broad band light beams 4z (parallel to the z axis) are vertically directed to the first and second registration accuracy measurement marks 1 and 2 as well as to resist 3, as shown in FIG. 2.

At this time, of light beams 4z, a beam incident on an upper surface of measurement mark 2 will be referred to as incident light beam 4a, beam reflected at the upper surface of second registration accuracy measurement mark 2 as reflected light beam 4b, a beam incident on an upper surface of first registration accuracy measurement mark 1 as incident light beam 4c and a beam reflected on the upper surface of first registration accuracy measurement mark 1 as reflected light beam 4d. A light beam which passes through resist 3 and is incident on the upper surface of first registration accuracy mark 1 will be referred to as incident light beam 4e, a beam which is passed through resist 3 and reflected at the upper surface of first registration accuracy measurement mark 1 as reflected light beam 4f, a beam which is passed through resist 3 and is incident on the upper surface of the chip as incident light beam 4g, a beam which is passed through resist 3 and reflected at the upper surface of the chip as reflected light beam 4h, a beam incident on the upper surface of the chip as incident light beam 4i, and a beam reflected at the upper surface of the chip as reflected light beam 4j.

Figure 3:
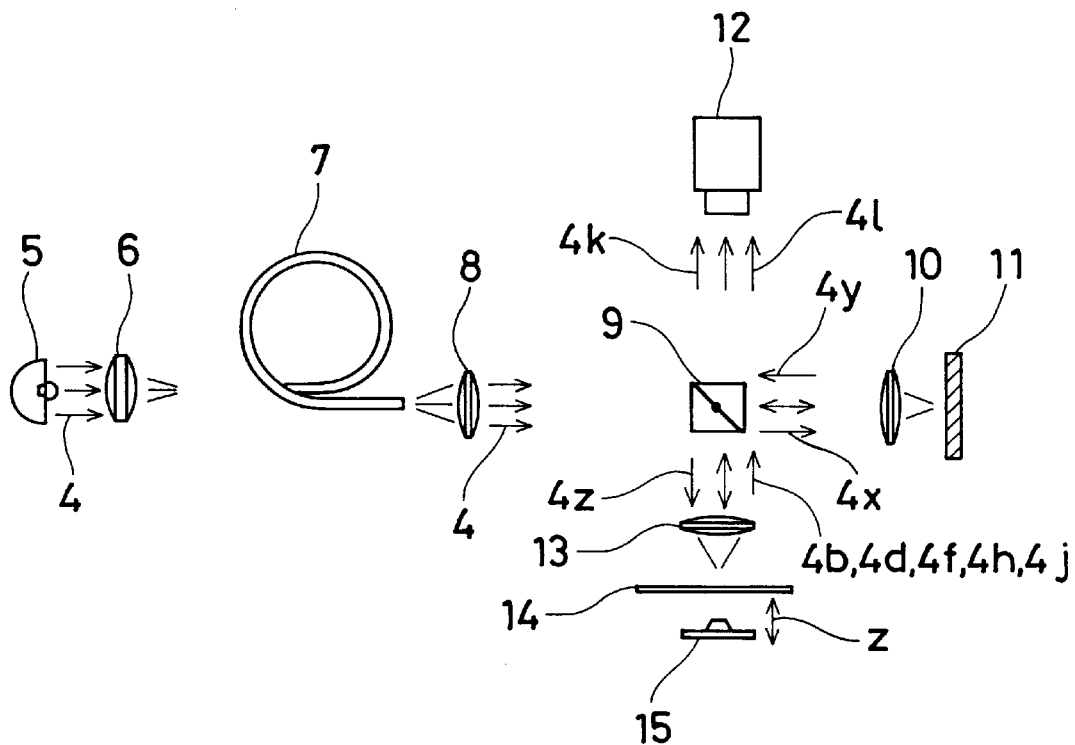
FIG. 3 is a schematic diagram of an optical interferometer in accordance with the first embodiment of the present invention.

Referring to FIG. 3, in the optical interferometer used in the present embodiment, light beams (broad band light beams) 4 coming out from light source 5 are collected by a lens 6. The collected light beams are passed through a fiber optic transmission 7 and collimated by a lens 8. The collimated beam 4 coming out from lens 8 is split into a beam 4x (parallel to the x axis in FIG. 2) which is transmitted through a half mirror 9, and a light beam 4z (parallel to the z axis in FIG. 2) which is reflected by half mirror 9. Light beam 4x which has passed through half mirror 9 further passes through a lens 10 and reflected by a reference mirror 11 to be a light beam 4y. Light beam 4y passes through lens 10 again in opposite direction and enters half mirror 9. Light beam 4j reflected downward in FIG. 3 by half mirror 9 is collected by a lens 13 and reaches an area of collection 14. When a semiconductor device 15 of which step is to be measured passes the area 14, reflected light beams 4b, 4d, 4f, 4h and 4j again pass through lens 13 upward and reach half mirror 9.

At this time, reflected light beam 4y reflected by reference mirror 11 passes through lens 10 and is split into a reflected light beam 4k reflected upward by half mirror 9, and a light beam passing through half mirror 9 and returning to the direction of light source 5. Each of the reflected light beams 4b, 4d, 4f, 4h and 4j reflected from semiconductor device 15 is split into a transmission light beam 1 which is passed through half mirror 9 upward, and a light beam returning to the direction of light source 5 reflected by half mirror 9. Of these light beams, reflection light beam 4k and transmitted light beam 4l interfere with each other, increasing intensity thereof. Thus, data is detected as interference waveform, by means of a camera 12.

More specifically, when each reflection surface on the registration accuracy mark passes the area 14 of collection, interference waveform is detected.

Position of the upper surface of first registration accuracy measurement mark 1 is represented by a plane 17, and position of the upper surface of second measurement mark 2 is represented by a plane 18. Further, since resist 3 is on first measurement mark 1, and as resist 3 has refractive index n (1.5~1.8) which is higher than that of the air, optical distance or seeming distance x is given by x=n×d, where d represents the actual step d of first measurement mark 1. In other words, seeming distance of incident light beams 4e and 4g passing through resist 3 is longer. Therefore, the upper surface of the first measurement mark 1 on which resist 3 is provided appears to be lower, that is, seemingly at a position of 17a. Similarly, the surface 16 also appears to be lower, at a position 16a seemingly. At this time, interference waveforms appear as waveforms in proportion to the shape of respective surfaces, that is, the step (seeming step equal optical distance).

Figure 4:
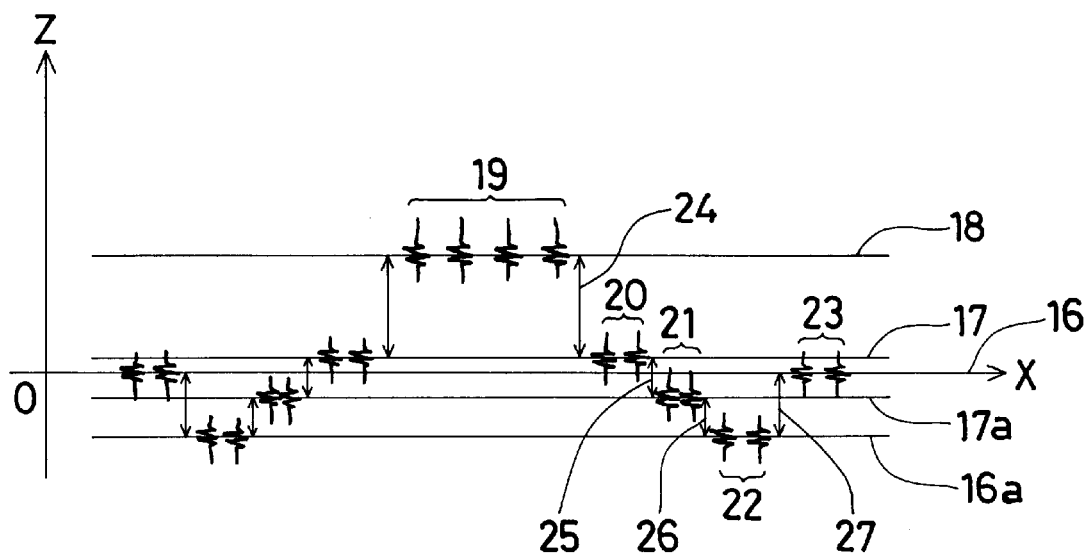
FIG. 4 is a schematic diagram of an interference waveforms detected by the optical interferometer in accordance with the first embodiment of the present invention.
Figure 5:
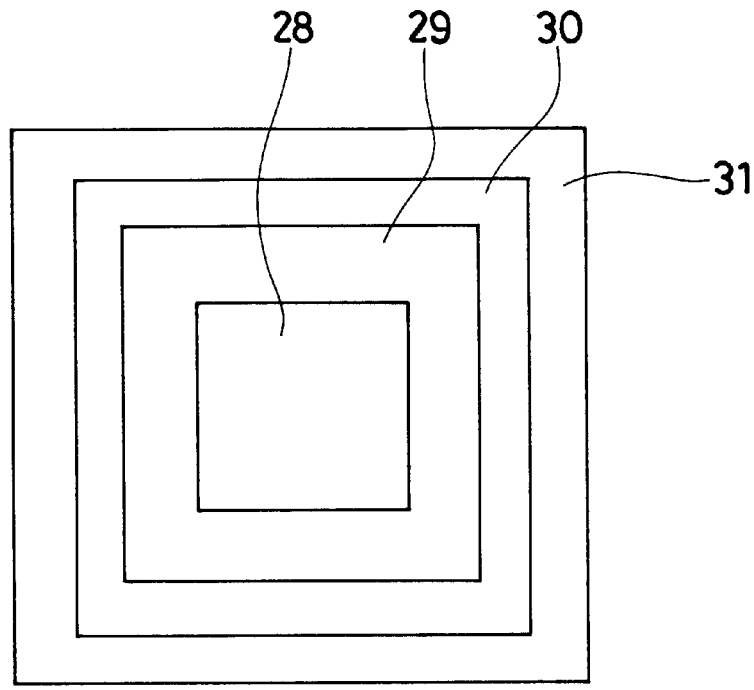
FIG. 5 is a plan view showing the interference waveform of FIG. 4 in pixel representation on the plan view of FIG. 1.

Referring to FIG. 4, interference waveform of reflected light beam 4b appears as interference waveform 19 at a plane 18. Similarly, interference waveform of reflected light beam 4d appears as interference waveform 20 at plane 17. Interference waveform of reflected light beam 4f appears as interference waveform 21 at plane 16. Interference waveform of reflected light beam 4h appears as interference light beam 22 at plane 17a, and an interference waveform of reflected light beam 4j appears as interference waveform 23 at plane 126a. At this time, edge portions of registration accuracy measurement marks are detected by finding a step 24 between interference waveforms 19 and 20, a step 25 between interference waveforms 20 and 21, a step 26 between interference waveforms 21 and 22, and a step 27 between interference waveforms 22 and 23. More specifically, as resist 3 is placed on the edge portion of the first registration accuracy measurement mark 1, the step between planes 16 and 17 is detected as converted to a step 26 between planes 17a and 16a, whereby identification of the step is facilitated. At this time, a method of finding by different colors of pixel representation 28, 29, 30 and 31 shown in FIG. 5 also facilitates identification. As a result, an amount of offset between the first and second registration accuracy measurement marks 1 and 2 can more easily be calculated. This results in improved registration accuracy in the process for manufacturing the semiconductor devices.

As for the method of calculating the amount of offset, first, distances a and b which are the distance between edge portions of left and right (or upper and lower) edge portions of the first registration accuracy measurement mark 1 and left and right (or upper and lower) edge portions of the second registration accuracy measurement marks 2, respectively, of FIG. 1, from steps 24 and 26 shown in FIG. 4. The amount of offset between the first and second measurement marks 1 and 2 is calculated as offset amount= (a−b)/2. Further, by calculating an average value of the amount of offset of each chip and 3a (a: standard deviation), an amount of offset in registration of the overall wafer can be found.

Figure 6:
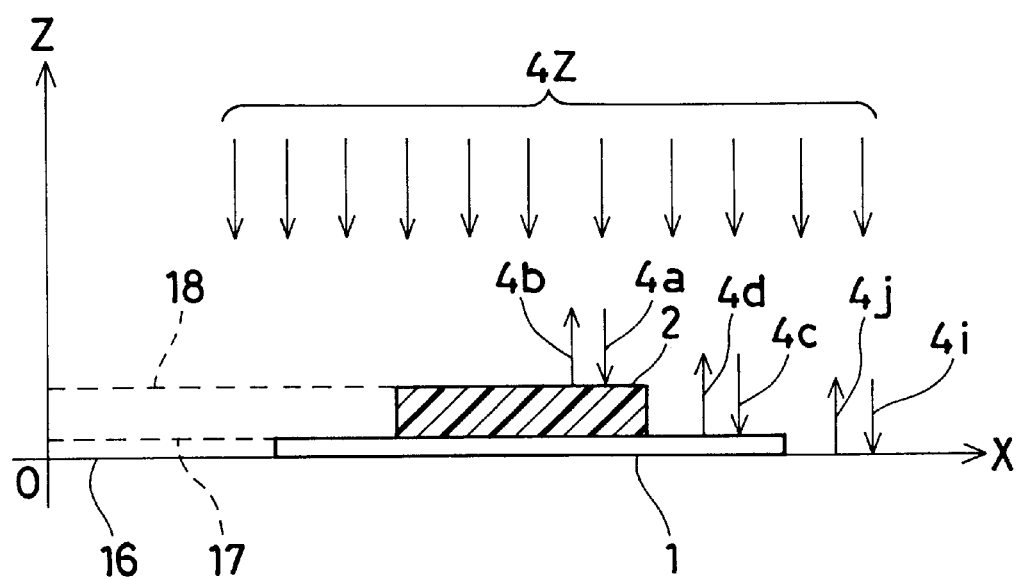
FIG. 6 is a cross section when a resist is not formed, in the method of improving registration accuracy in accordance with the first embodiment of the present invention.
Figure 7:
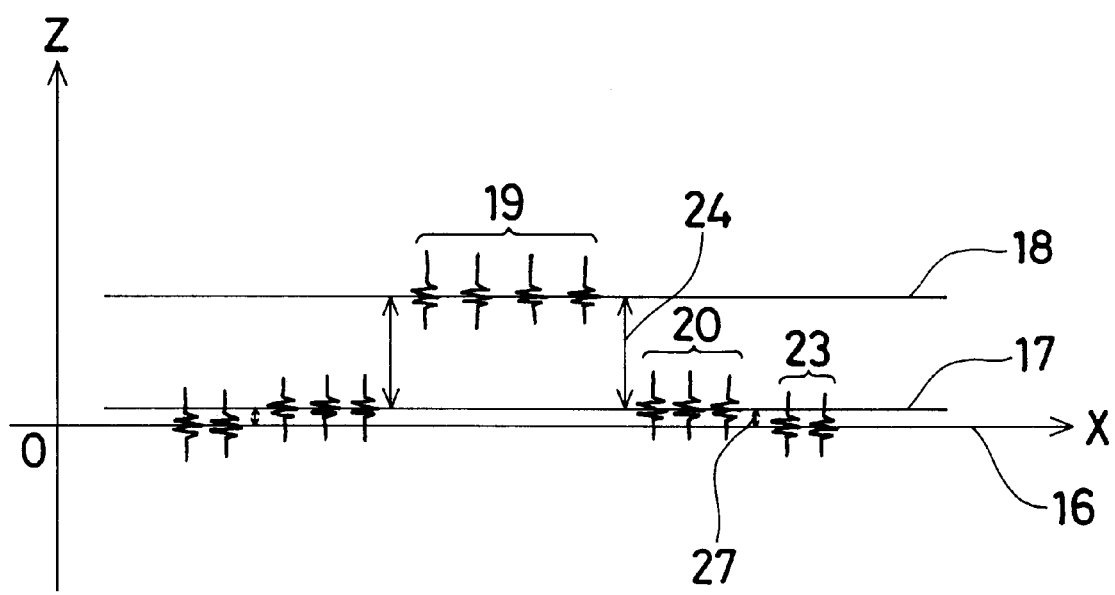
FIG. 7 is a schematic diagram showing interference waveform detected by the registration accuracy measurement mark of FIG. 6, for comparing of the method of improving registration accuracy in accordance with the first embodiment of the present invention with an example where the resist is not formed.

Referring to FIG. 6, in the step of registration of semiconductor devices, the first registration accuracy measurement mark 1 is formed on the upper surface of the chip (on x axis), and the second registration accuracy measurement mark 2 is formed on the first registration accuracy measurement mark 1. At this time, light beams 4z are directed to the first and second registration accuracy measurement marks 1 and 2 as well as to the chip upper surface 16. Of the light beams 4z, a beam incident on the upper surface of the second measurement mark 2 will be referred to as incident light beam 4a, a beam reflected at the upper surface of the second measurement mark 2 as reflected light beam 4b, a light beam incident on the upper surface of the first measurement mark 1 as incident light beam 4c, a light beam reflected at the upper surface of the first measurement mark 1 as reflected light beam 4d, a beam incident on the upper surface of the chip as incident light beam 4i and a beam reflected at the upper surface of the chip as reflected light beam 4j. Further, a plane on the chip, that is, the plane corresponding to the value z in z axis will be referred to as plane 16, the upper surface of the first measurement mark 1 as plane 17 and the upper surface of the second registration accuracy measurement mark 2 as plane 18.

These planes 16, 17 and 18 are measured by using the optical interferometer shown in FIG. 3. As a result, interference waveform 19 of the beam reflected from plane 18, interference waveform 20 from plane 17 and interference waveform 23 from plane 16 are detected as shown in FIG. 17. Consequently, a step 24 between planes 18 and 17 as well as a step 27 between planes 17 and 16 are detected. At this time, it is understood that the step 27 is small and difficult to detect. Therefore, it is understood that in the comparative example in which resist 3 is not formed on the edge portion of the first registration accuracy measurement mark 1, detection of the step is difficult. Therefore, the above described effect of resist 3 formed on the edge portion of the first registration accuracy measurement mark 1 in accordance with the first embodiment of the present invention is clearly recognized.

Second Embodiment

Figure 8:
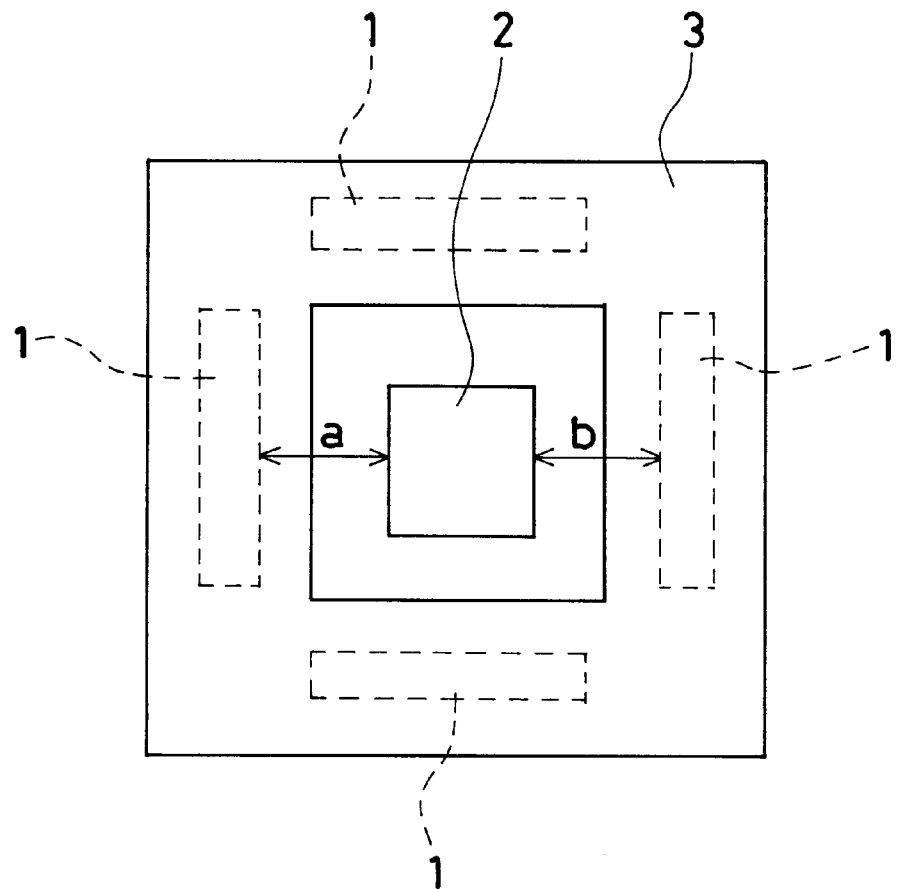
FIG. 8 is a plan view of the registration accuracy measurement mark and the resist in accordance with a second embodiment of the present invention.
Figure 9:
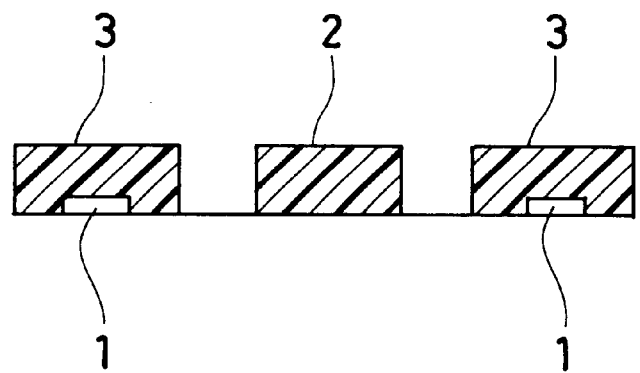
FIG. 9 is a cross sectional view of the registration accuracy measurement mark and the resist in accordance with the second embodiment of the present invention.
Figure 10:
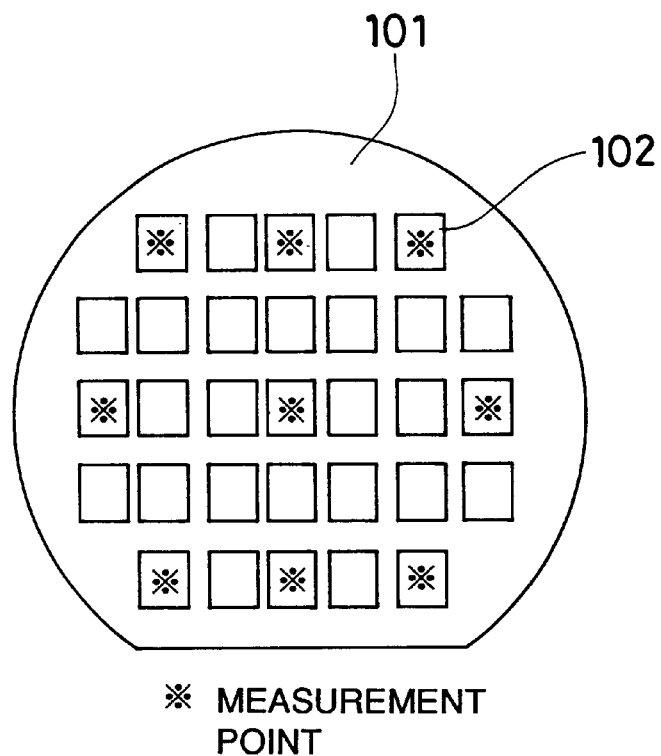
FIG. 10 is a schematic diagram showing measurement mark measuring points on chips of a wafer of conventional semiconductor devices.
Figure 11:
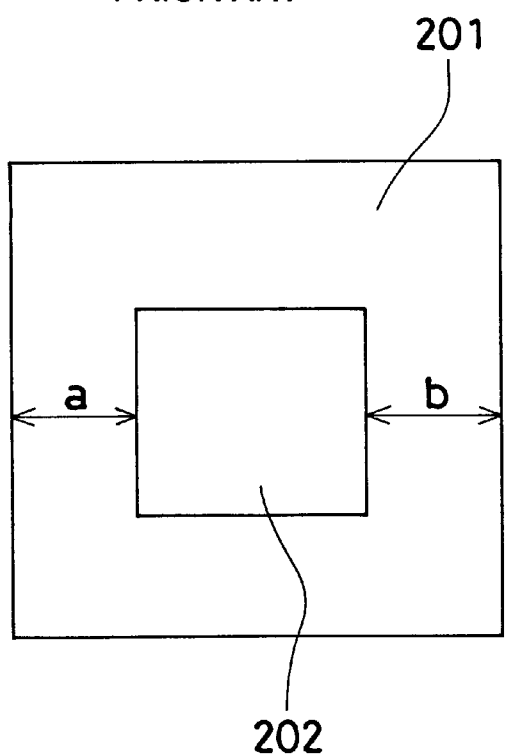
FIG. 11 is a plan view showing a conventional registration accuracy measurement mark.
Figure 12:
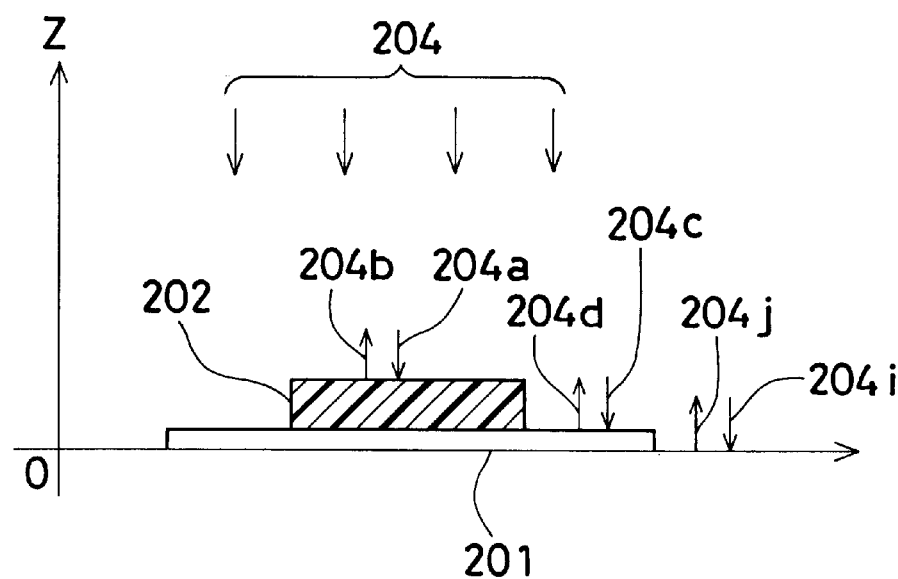
FIG. 12 is a cross sectional view showing the conventional registration accuracy measurement mark.
Figure 13:
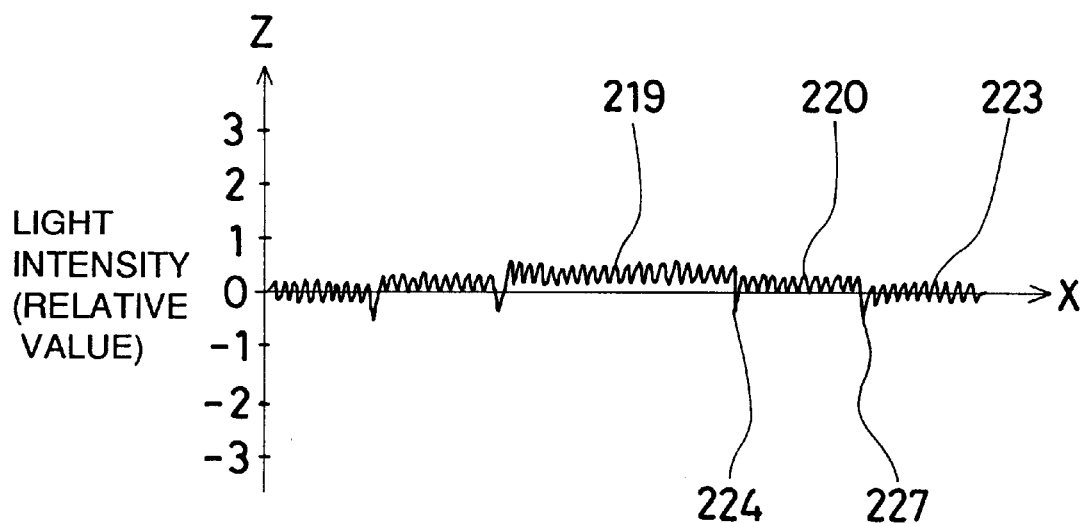
FIG. 13 is a graph showing conventional detection data for finding a position of the registration accuracy measurement mark in accordance with light intensity.

Referring to FIGS. 8 and 9, the first registration accuracy measurement mark 1 including four bar shaped parts are formed to surround an area where the second registration accuracy measurement mark 2 is to be formed. Inside the first registration accuracy measurement mark 1 including four parts, the second registration accuracy measurement mark 2 formed of a resist is formed such that edges of the second measurement mark 2 are parallel to inner edges of the four parts of the first measurement mark 1, respectively. Further, simultaneously with the formation of the second registration accuracy measurement mark 2 formed of resist, resist 3 is formed to cover edge portions of the first registration accuracy measurement mark 1. By this structure, it becomes possible to readily detect even a small step of the first registration accuracy measurement mark 1 by the optical interferometer shown in FIG. 3, as in the first embodiment. As a result, the amount of offset of the registration accuracy measurement marks can readily be calculated. This results in improved registration accuracy in the process for manufacturing the semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of improving registration accuracy in a step of exposure during manufacturing of a semiconductor device, comprising the steps of:

forming a registration accuracy measurement mark on a semiconductor substrate;

forming a first resist film covering at least an edge portion of said registration accuracy measurement mark; and thereafter, detecting a position of the edge portion of said registration accuracy measurement mark by an optical system utilizing interference.

2. The method of improving registration accuracy according to claim 1, wherein said registration accuracy measurement mark includes
a first registration accuracy measurement mark formed of a first layer, and
a second registration accuracy measurement mark formed of a second layer inside an area where said first registration accuracy measurement mark is formed;

said first resist film is formed to cover at least an edge portion of said first registration accuracy measurement mark; and positions of edge portions of said first and second registration accuracy measurement marks are detected by said optical system utilizing interference, so that an amount of offset between said first and second registration accuracy measurement marks is calculated.

3. The method of improving registration accuracy according to claim 2, wherein said second registration accuracy measurement mark is formed on a planar area where said first registration accuracy mark is formed, such that the second registration accuracy measurement mark has smaller planar area than the planar area where said first registration accuracy measurement mark is formed.

4. The method of improving registration accuracy according to claim 2, wherein said first registration accuracy measurement mark includes a plurality of parts formed to surround said second registration accuracy measurement mark; and said first resist film is formed to cover at least inner and outer end portions of said plurality of parts.

5. The method of improving registration accuracy according to claim 2, wherein said second registration accuracy measurement mark includes a second resist film formed of same layer as said first resist film.

6. The method of improving registration accuracy according to claim 1, wherein said optical system utilizing interference includes a light source, a first mirror for splitting a light beam from said light source into two light beams, and a second mirror for reflecting one of said splitted light beams.

7. A method of forming a pattern on a substrate, comprising the steps of:

forming a registration accuracy measurement mark on a semiconductor substrate utilizing a method of improving registration accuracy including the steps of forming a registration accuracy measurement mark on a semiconductor substrate, forming a first resist film covering at least an edge portion of said registration accuracy measurement mark, and thereafter, detecting position of the edge portion of said registration accuracy measurement mark by an optical system utilizing interference.

* * * * *